United States Patent
Tseng

(10) Patent No.: US 7,876,629 B2
(45) Date of Patent: Jan. 25, 2011

(54) MEMORY CONTROL METHODS CAPABLE OF DYNAMICALLY ADJUSTING SAMPLING POINTS, AND RELATED CIRCUITS

(75) Inventor: Jui-Hsing Tseng, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 627 days.

(21) Appl. No.: 11/835,422

(22) Filed: Aug. 8, 2007

(65) Prior Publication Data

US 2009/0043953 A1  Feb. 12, 2009

(51) Int. Cl.
*G11C 7/00* (2006.01)
(52) U.S. Cl. .................. 365/193; 365/189.05; 365/194; 365/233.13
(58) Field of Classification Search ............ 365/189.05, 365/193, 194, 233.13
See application file for complete search history.

(56) References Cited

U.S. PATENT DOCUMENTS 5,948,083 A * 9/1999 Gervasi ....................... 710/62
6,262,611 B1 * 7/2001 Takeuchi .................... 327/159
7,076,678 B2 * 7/2006 LaBerge ..................... 713/401
7,443,738 B2 * 10/2008 Kwack et al. ........... 365/189.05
7,450,443 B2 * 11/2008 Cheng ........................ 365/193

FOREIGN PATENT DOCUMENTS

CN         1630856 A          6/2005

* cited by examiner

*Primary Examiner*—Dang T Nguyen
*Assistant Examiner*—Alexander Sofocleous
(74) *Attorney, Agent, or Firm*—Winston Hsu; Scott Margo

(57) ABSTRACT

A memory control method for adjusting sampling points utilized by a memory control circuit receiving a data signal and an original data strobe signal of a memory includes: utilizing at least one delay unit to provide a plurality of sampling points according to the original data strobe signal; sampling according to the data signal by utilizing the plurality of sampling points; and analyzing sampling results to dynamically determine a delay amount for delaying the original data strobe signal, whereby a sampling point corresponding to the delayed data strobe signal is kept centered at data carried by the data signal.

20 Claims, 6 Drawing Sheets

MEMORY CONTROL METHODS CAPABLE OF DYNAMICALLY ADJUSTING SAMPLING POINTS, AND RELATED CIRCUITS

BACKGROUND

The present invention relates to memory control, and more particularly, to memory control methods capable of dynamically adjusting sampling points, and related circuits.

Please refer to FIG. 1. FIG. 1 illustrates a memory module 10 of a dynamic random access memory (DRAM) 12 and a controller 14 according to the related art, where the controller 14 accesses the DRAM 12 by utilizing a data signal such as a DQ signal and a data strobe signal such as a DQS signal as shown in FIG. 1. Principles and operations of the DQ signal and the DQS signal are well known to those skilled in the related art, and therefore are not explained in detail.

Typically, a manufacturer of an electronic device comprising the memory module 10 needs to combine individual components of the DRAM 12 and the controller 14 from different respective component providers, and therefore may be required to fine-tune at least one fixed delay amount for delaying the DQ signal and/or the DQS signal within the memory module 10 in order to achieve better performance of memory control. When the electronic device is sold to a reseller or an end user, the fixed delay amount will no longer be changed.

However, phases of the DQ signal and the DQS signal may fluctuate due to interference from noise or internal/external environmental reasons such as temperature variation. Therefore, it is not possible for the memory module 10, and more specifically, for the controller 14 to achieve the best performance of memory control by utilizing the fixed delay amount.

SUMMARY

It is an objective of the claimed invention to provide memory control circuits and methods to solve the above-mentioned problem.

It is another objective of the claimed invention to provide memory control circuits and methods in order to dynamically adjust sampling points.

It is another objective of the claimed invention to provide memory control circuits and methods in order to achieve the best performance of memory control by utilizing dynamically adjusted sampling points.

An exemplary embodiment of a memory control circuit receiving a data signal and an original data strobe signal of a memory comprises: at least one delay unit for generating at least a first data strobe signal, a second data strobe signal, and a third data strobe signal according to the original data strobe signal to provide at least three sampling points respectively; a sampling unit, coupled to the delay unit, for sampling according to the data signal by utilizing the first data strobe signal, the second data strobe signal, and the third data strobe signal to derive a first sample signal, a second sample signal, and a third sample signal respectively; and a determining unit, coupled to the sampling unit, for comparing the first sample signal, the second sample signal, and the third sample signal to adjust spans between the sampling points respectively corresponding to the first data strobe signal, the second data strobe signal, and the third data strobe signal.

An exemplary embodiment of a memory control method for adjusting sampling points utilized by a memory control circuit receiving a data signal and an original data strobe signal of a memory comprises: utilizing at least one delay unit to provide a plurality of sampling points according to the original data strobe signal; sampling according to the data signal by utilizing the plurality of sampling points; and analyzing sampling results to dynamically determine a delay amount for delaying the original data strobe signal, whereby a sampling point corresponding to the delayed data strobe signal is kept centered at data carried by the data signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
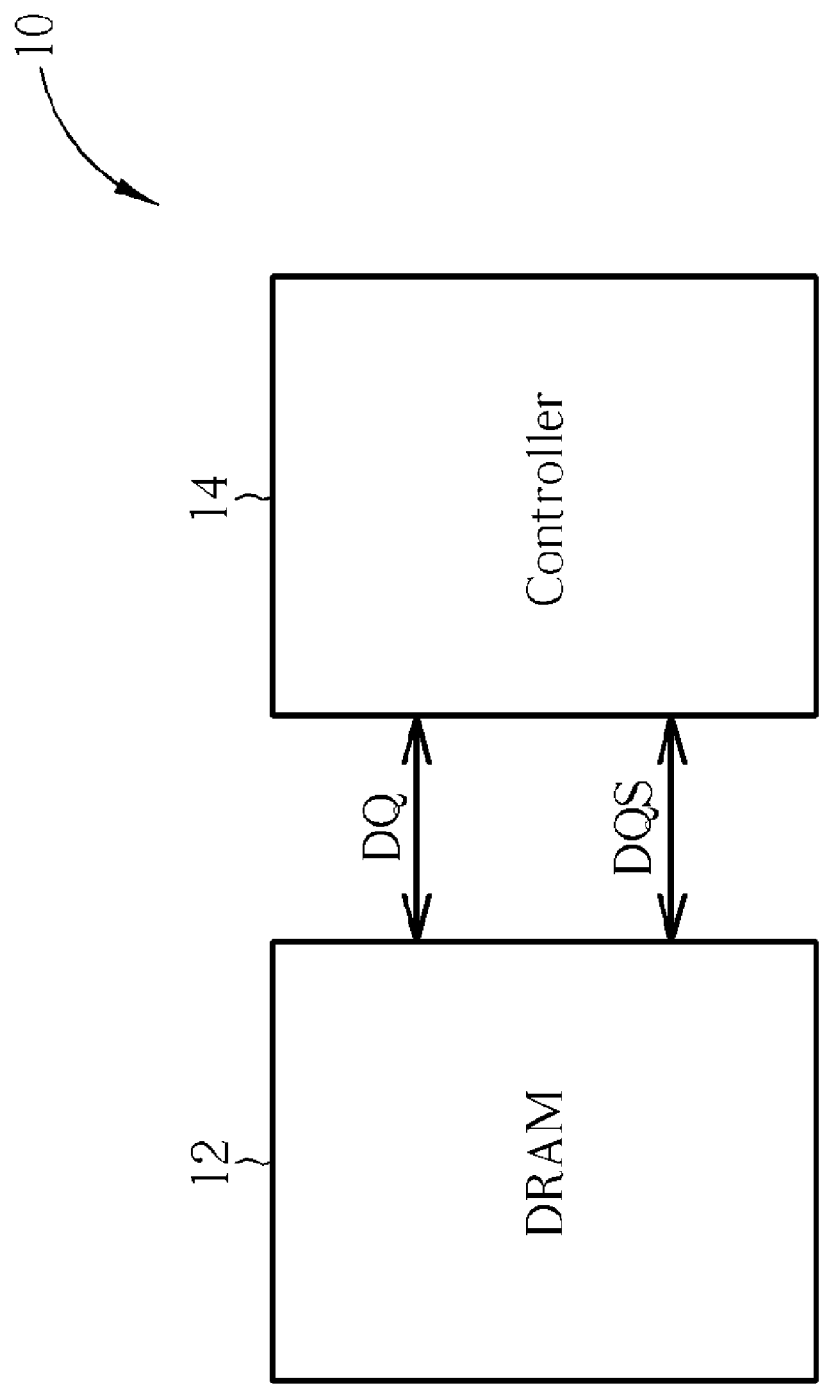
FIG. 1 illustrates a combination of a dynamic random access memory (DRAM) and a controller according to the related art.
Figure 2:
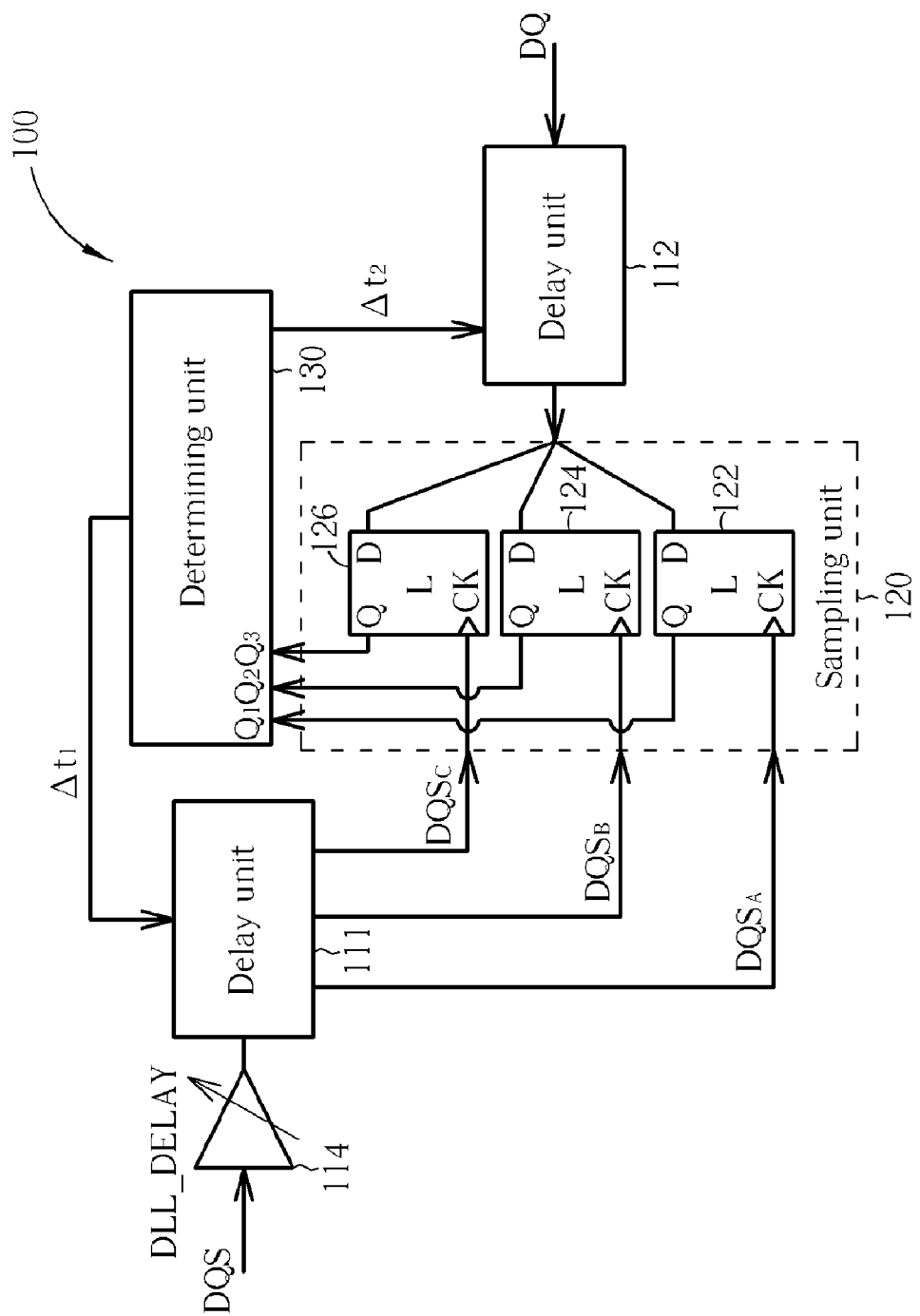
FIG. 2 is a block diagram of a memory control circuit according to a first embodiment of the present invention.

Please refer to FIG. 2. FIG. 2 is a block diagram of a memory control circuit 100 according to a first embodiment of the present invention. In this embodiment the memory control circuit 100 comprises a plurality of delay units 111, 112, and 114, a sampling unit 120, and a determining unit 130, and receives a data signal such as the DQ signal and an original data strobe signal such as the DQS signal through the delay units 112 and 114 respectively. In addition, the delay unit 114 of this embodiment comprises a single delay cell having an adjustable delay amount DLL_DELAY as shown in FIG. 2, where the adjustable delay amount DLL_DELAY is set as a constant phase delay of 90 degrees. As shown in FIG. 2, the sampling unit 120 of this embodiment comprises a plurality of latches (L) 122, 124, and 126.

Figure 3:
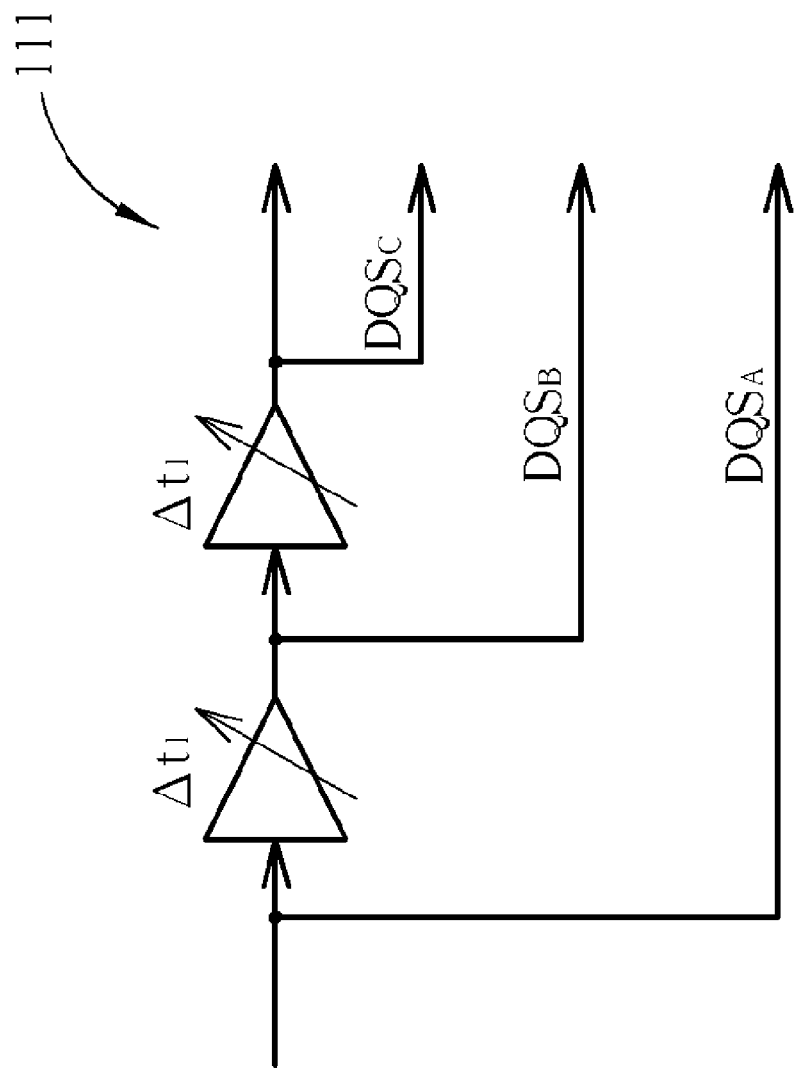
FIG. 3 illustrates implementation details of one of the delay units shown in FIG. 2 according to the first embodiment.

Please refer to FIG. 2 and FIG. 3. FIG. 3 illustrates implementation details of the delay unit 111 shown in FIG. 2 according to the first embodiment. The delay unit 111 of this embodiment comprises two delay cells, each of which has an adjustable delay amount $\Delta t_1$ as shown in FIG. 3. Similarly, the delay unit 112 of this embodiment may comprise at least one delay cell, one of which has an adjustable delay amount $\Delta t_2$.

According to this embodiment, the determining unit 130 is capable of setting the same initial value for the two adjustable delay amounts $\Delta t_1$ and $\Delta t_2$, and further dynamically determining and adjusting the adjustable delay amounts $\Delta t_1$ and $\Delta t_2$ for the delay units 111 and 112 respectively, as shown in FIG. 2.

Figure 4:
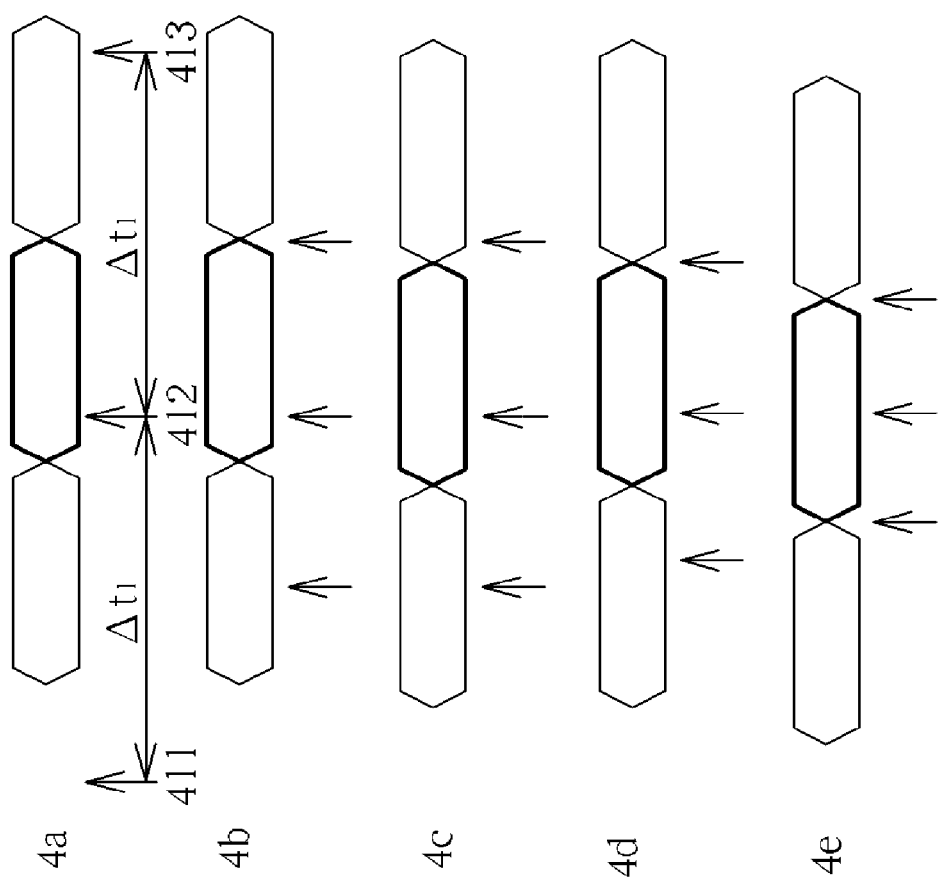
FIG. 4 is a timing chart illustrating how a memory control method dynamically adjusts sampling points according to one embodiment of the present invention.

FIG. 4 is a timing chart illustrating how a memory control method dynamically adjusts sampling points utilized by a memory control circuit receiving a data signal and an original data strobe signal of a memory according to one embodiment of the present invention, where the memory of this embodiment is a double data rate (DDR) memory. The memory control method can be applied to the first embodiment, and can further be described as follows.

By utilizing at least one delay unit, and more specifically, by utilizing a plurality of delay units, such as the delay units 111, 112, and/or 114, the memory control circuit 100 is capable of generating at least three data strobe signals $DQS_A$, $DQS_B$, and $DQS_C$ according to the original data strobe signal DQS to provide a plurality of sampling points, and more particularly, to provide at least three sampling points such as the sampling points 411, 412, and 413, respectively. In addition, the latches 122, 124, and 126 of the sampling unit 120 are capable of sampling according to the data signal DQ by utilizing the plurality of sampling points (e.g. the sampling points 411, 412, and 413), respectively.

As shown in FIG. 2, the latches 122, 124, and 126 receive and sample a delayed signal of the data signal DQ, where the delay unit 112 generates the delayed signal of the data signal DQ by applying at least the adjustable delay amount $\Delta t_2$ mentioned above to the data signal DQ, or substantially outputs the data signal DQ if the adjustable delay amount $\Delta t_2$ is occasionally zero. Thus, the latches 122, 124, and 126 of the sampling unit 120 sample the data signal DQ or the delayed signal thereof by utilizing the data strobe signals $DQS_A$, $DQS_B$, and $DQS_C$ to derive a first sample signal, a second sample signal, and a third sample signal respectively.

Regarding the determining unit 130 shown in FIG. 2, the notations $Q_1$, $Q_2$, and $Q_3$ labeled at its input terminals for respectively receiving the first sample signal, the second sample signal, and the third sample signal mentioned above are utilized for representing sampling results carried by the first sample signal, the second sample signal, and the third sample signal, respectively. The determining unit 130 is capable of analyzing the sampling results $Q_1$, $Q_2$, and $Q_3$ to dynamically determine the latest value of at least one delay amount such as the adjustable delay amount $\Delta t_1$ for delaying the original data strobe signal DQS and the adjustable delay amount $\Delta t_2$ for delaying the data signal DQ, whereby a sampling point corresponding to the delayed data strobe signal can be kept centered at data carried by the data signal DQ.

For example, in an initial state shown in FIG. 4a, the sampling point 412 corresponding to the data strobe signal $DQS_B$ is not centered at the data carried by the data signal DQ, where the span between the sampling point 411 corresponding to the data strobe signal $DQS_A$ and the sampling point 412 corresponding to the data strobe signal $DQS_B$ is equal to the adjustable delay amount $\Delta t_1$, and the span between the sampling point 413 corresponding to the data strobe signal $DQS_C$ and the sampling point 412 corresponding to the data strobe signal $DQS_B$ is also equal to the adjustable delay amount $\Delta t_1$ in this embodiment. Referring to FIG. 4a though FIG. 4e, the sampling points respectively corresponding to the data strobe signals $DQS_A$, $DQS_B$, and $DQS_C$ are dynamically adjusted. As a result, in a steady state shown in FIG. 4e, the sampling point corresponding to the data strobe signal $DQS_B$ (i.e. the middle sampling point) is centered at the data carried by the data signal DQ.

According to this embodiment, the determining unit 130 compares the sampling results $Q_1(i)$, $Q_2(i)$, and $Q_3(i)$ (i=1, 2, 3, ..., etc.) respectively carried by the first sample signal, the second sample signal, and the third sample signal to adjust the spans between the sampling points respectively corresponding to the data strobe signals $DQS_A$, $DQS_B$, and $DQS_C$, and to further adjust shift amounts of the data strobe signals $DQS_A$, $DQS_B$, and $DQS_C$.

More specifically, in this embodiment, with $i_1$ representing a specific value of i, if a sampling result $Q_1(i_1)$ carried by the first sample signal is not equivalent to a sampling result $Q_2(i_1)$ carried by the second sample signal, and if the sampling result $Q_2(i_1)$ carried by the second sample signal is not equivalent to a sampling result $Q_3(i_1)$ carried by the third sample signal, i.e. the situation where $Q_1(i_1) \neq Q_2(i_1) \neq Q_3(i_1)$, the determining unit 130 adjusts the spans between the sampling points respectively corresponding to the data strobe signals $DQS_A$, $DQS_B$, and $DQS_C$. As shown in FIG. 4, the adjustment of the spans in this embodiment is decreased.

In addition, with $i_2$ representing another specific value of i, if another sampling result $Q_2(i_2)$ carried by the second sample signal is equivalent to another sampling result carried by one sample signal out of the first sample signal and the third sample signal, and if the sampling result $Q_2(i_2)$ carried by the second sample signal is not equivalent to another sampling result carried by the other sample signal out of the first sample signal and the third sample signal, i.e. the situation where $Q_1(i_2) \neq Q_2(i_2) \neq Q_3(i_2)$ or the situation where $Q_1(i_2) \neq Q_2(i_2) = Q_3(i_2)$, the determining unit 130 adjusts the shift amounts of the data strobe signals $DQS_A$, $DQS_B$, and $DQS_C$. In this embodiment, the situation where $Q_1(i_2) \neq Q_2(i_2) \neq Q_3(i_2)$ is considered as a phase shift lead status, while the situation where $Q_1(i_2) \neq Q_2(i_2) \neq Q_3(i_2)$ is considered as a phase shift lag status.

By dynamically adjusting the sampling points respectively corresponding to the data strobe signals $DQS_A$, $DQS_B$, and $DQS_C$ as mentioned above, a steady state such as that shown in FIG. 4e can be achieved. Thus, the memory control circuit 100 is capable of dynamically keeping the sampling point corresponding to the data strobe signal $DQS_B$ (i.e. the middle sampling point of the aforementioned three sampling points) centered at the data carried by the data signal DQ. Additionally, the memory control circuit 100 is capable of dynamically keeping the sampling point corresponding to the data strobe signal $DQS_A$ (i.e. the first sampling point of the three sampling points) centered at a prior data transition time point adjacent to the data, and further dynamically keeping the sampling point corresponding to the data strobe signal $DQS_C$ (i.e. the last sampling point of the three sampling points) centered at a posterior data transition time point adjacent to the data, in order to lock the data carried by the data signal DQ with the window formed with the three sampling points mentioned above. Therefore, the memory control circuit 100 may dynamically adjust the sampling points to correctly derive data carried by the data signal DQ according to the data strobe signal $DQS_B$.

It is noted that, in this embodiment, the data carried by the data signal DQ can be normal data rather than data of a specialized or customer designed pattern. According to a variation of the first embodiment, the data carried by the data signal DQ corresponds to a specific test pattern such as an alternatively varied pattern $\{0, 1, 0, 1, \ldots\}$.

Figure 5:
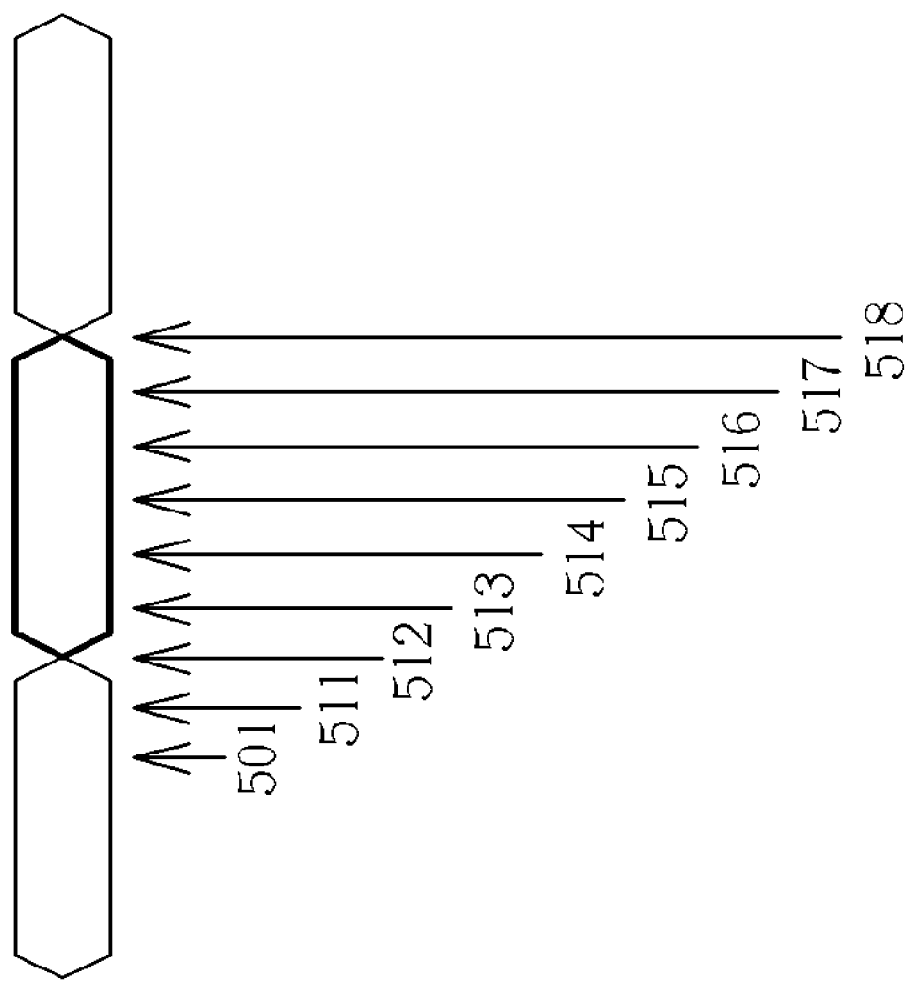
FIG. 5 is a timing chart illustrating how a memory control method dynamically adjusts sampling points according to another embodiment of the present invention.
Figure 6:
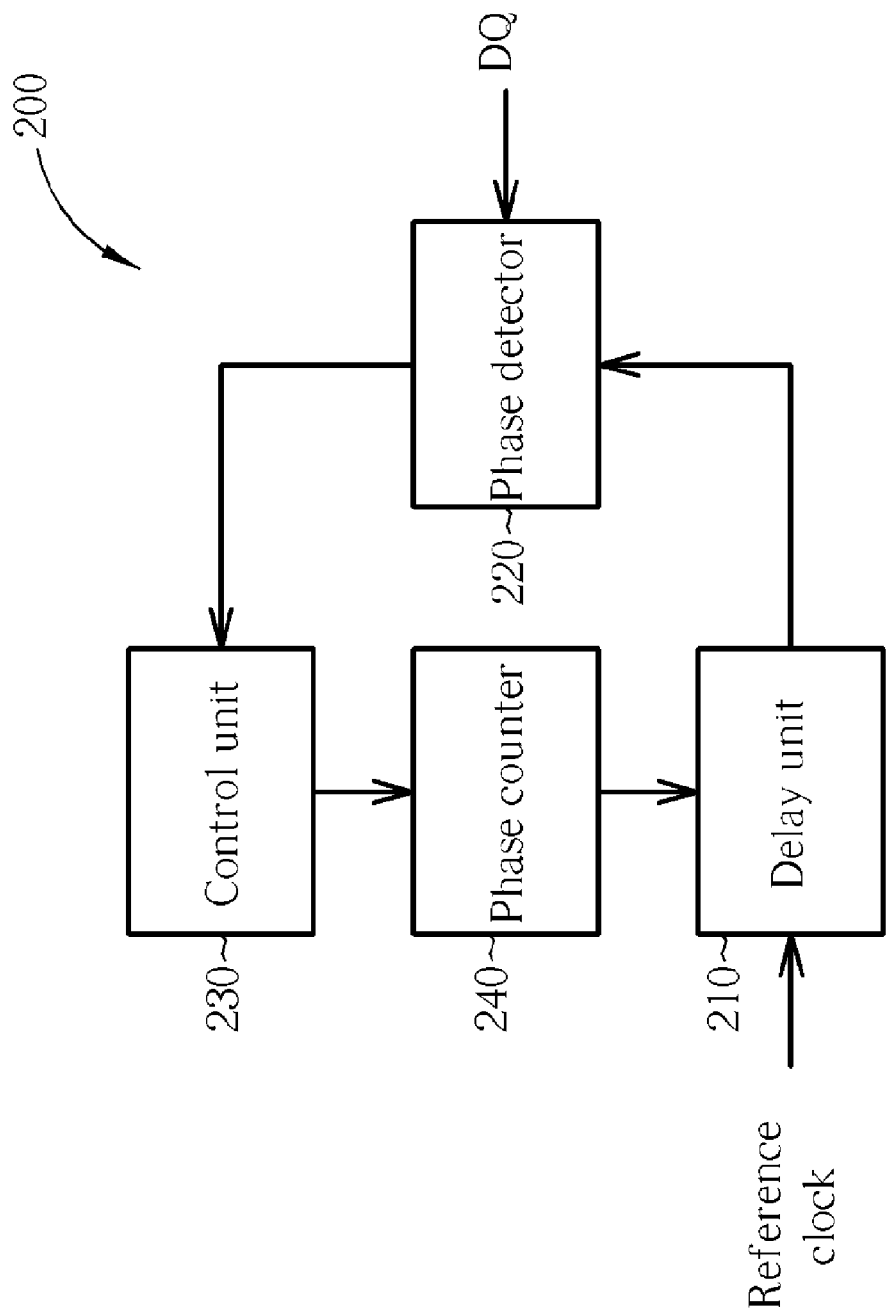
FIG. 6 is a block diagram of a memory control circuit according to a second embodiment of the present invention.

Please refer to FIG. 5 and FIG. 6. FIG. 5 is a timing chart illustrating how a memory control method dynamically adjusts sampling points according to another embodiment of the present invention, where the embodiment shown in FIG. 5 is a variation of the embodiment shown in FIG. 4. FIG. 6 is a block diagram of a memory control circuit 200 according to a second embodiment of the present invention, where the memory control circuit 200 comprises a delay unit 210, a phase detector 220, a control unit 230, and a phase counter 240. The memory control method in the embodiment shown in FIG. 5 can be applied to the second embodiment, and can be described as follows.

According to the second embodiment, the data carried by the data signal DQ corresponds to a specific test pattern such as the alternatively varied pattern {0, 1, 0, 1, . . . }. The reference clock shown in FIG. 6 can be an internal reference clock or a data strobe signal such as the data strobe signal DQS mentioned above. The delay unit 210 delays the reference clock with an adjustable delay amount determined by the phase counter 240 to generate a delayed clock, in order to provide a plurality of sampling points such as the sampling points 511, 512, . . . , and 518 shown in FIG. 5, where the spans between a reference point 501 and the sampling points 511, 512, . . . , and 518 correspond to a plurality of delay amounts determined by the phase counter 240 in different respective times of iterations.

In order to sample the data signal DQ by utilizing the plurality of sampling points, the phase detector 220 of this embodiment performs phase detection on the data signal DQ according to the delayed clock from the delay unit 210. In addition, the control unit 230 of this embodiment determines whether a series of sampling results from the phase detector 220 are equal to 0 or 1, and finds a sampling point corresponding to one of two transition patterns such as {0, 1} and {1, 0} (e.g. the sampling point 512) and further finds the next sampling point corresponding to the other of the two transition patterns (e.g. the time point 518), in order to perform edge detection. As a result, the control unit 230 may analyze the sampling results from the phase detector 220, in order to dynamically determine the delay amount according to the edge detection and control the delay unit 210 by utilizing the phase counter 240. According to this embodiment, after the edge detection is completed, the middle sampling point between the aforementioned two sampling points respectively corresponding to the two transition patterns (e.g. the sampling point 515) is determined as the optimized sampling point.

In contrast to the prior art, the memory control circuits and methods of the present invention are capable of dynamically adjusting sampling points, in order to achieve the best performance of memory control.

It is another advantage of the claimed invention that, in the situation where the phases of the DQ signal and the DQS signal fluctuate due to interference from noise or internal/external environmental reasons such as temperature variation, the memory control circuits and methods of the present invention can still achieve the best performance of memory control.

Those skilled in the art will readily observe that numerous modifications and alterations of the device and method may be made while retaining the teachings of the invention.

What is claimed is:

1. A memory control circuit receiving a data signal and an original data strobe signal of a memory, the memory control circuit comprising:
   at least one first delay unit for generating at least a first data strobe signal, a second data strobe signal, and a third data strobe signal according to the original data strobe signal to provide at least three sampling points respectively;
   a sampling unit, coupled to the first delay unit, for sampling according to the data signal by utilizing the first data strobe signal, the second data strobe signal, and the third data strobe signal, to derive a first sample signal, a second sample signal, and a third sample signal respectively;
   a determining unit, coupled to the sampling unit, for comparing the first sample signal, the second sample signal, and the third sample signal to adjust spans between the sampling points respectively corresponding to the first data strobe signal, the second data strobe signal, and the third data strobe signal; and
   at least one second delay unit to provide an adjustable delay to the data signal, wherein the determining unit is coupled to control the adjustable delay provided by the second delay unit.

2. The memory control circuit of claim 1, wherein the data signal is a DQ signal, and the original data strobe signal is a DQS signal.

3. The memory control circuit of claim 1, wherein the sampling unit samples the data signal or a delayed signal of the data signal according to the first data strobe signal, the second data strobe signal, and the third data strobe signal.

4. The memory control circuit of claim 1, wherein the determining unit compares the first sample signal, the second sample signal, and the third sample signal to further adjust shift amounts of the first data strobe signal, the second data strobe signal, and/or the third data strobe signal.

5. The memory control circuit of claim 1, wherein the memory control circuit is capable of dynamically adjusting the sampling points to correctly derive data carried by the data signal according to the second data strobe signal.

6. The memory control circuit of claim 5, wherein the memory control circuit is capable of dynamically keeping the sampling point corresponding to the second data strobe signal centered at the data carried by the data signal.

7. The memory control circuit of claim 6, wherein the memory control circuit is capable of dynamically keeping the sampling point corresponding to the first data strobe signal centered at a prior data transition time point adjacent to the data, and further dynamically keeping the sampling point corresponding to the third data strobe signal centered at a posterior data transition time point adjacent to the data.

8. The memory control circuit of claim 5, wherein if a sampling result carried by the first sample signal is not equivalent to a sampling result carried by the second sample signal, and if the sampling result carried by the second sample signal is not equivalent to a sampling result carried by the third sample signal, the determining unit adjusts the spans between the sampling points respectively corresponding to the first data strobe signal, the second data strobe signal, and the third data strobe signal.

9. The memory control circuit of claim 8, wherein if another sampling result carried by the second sample signal is equivalent to another sampling result carried by one sample signal out of the first sample signal and the third sample signal, and if the other sampling result carried by the second sample signal is not equivalent to another sampling result carried by the other sample signal out of the first sample signal and the third sample signal, the determining unit adjusts shift amounts of the first data strobe signal, the second data strobe signal, and/or the third data strobe signal.

10. The memory control circuit of claim 1, wherein data carried by the data signal is normal data, or corresponds to a specific test pattern.

11. A memory control method for adjusting sampling points utilized by a memory control circuit receiving a data signal and an original data strobe signal of a memory, the memory control method comprising:

utilizing at least one first delay unit to provide a plurality of sampling points according to the original data strobe signal;

sampling according to the data signal by utilizing the plurality of sampling points;

analyzing sampling results to dynamically determine a first delay amount for delaying the original data strobe signal and a second delay amount for delaying the data signal, whereby a sampling point corresponding to the delayed data strobe signal is kept centered at data carried by the data signal; and utilizing at least one second delay unit to provide the second delay amount to the data signal.

12. The memory control method of claim 11, wherein the data signal is a DQ signal, and the original data strobe signal is a DQS signal.

13. The memory control method of claim 11, wherein the step of utilizing the delay unit to provide the plurality of sampling points further comprises:

utilizing the delay unit to generate at least a first data strobe signal, a second data strobe signal, and a third data strobe signal according to the original data strobe signal to provide at least three sampling points respectively, wherein the second data strobe signal is substantially the delayed data strobe signal whose sampling point is kept centered at the data carried by the data signal;

wherein the step of sampling according to the data signal by utilizing the plurality of sampling points further comprises:

sampling according to the data signal by utilizing the first data strobe signal, the second data strobe signal, and the third data strobe signal.

14. The memory control method of claim 13, wherein in the step of sampling according to the data signal by utilizing the plurality of sampling points, a first sample signal, a second sample signal, and a third sample signal for carrying the sampling results are derived during sampling by utilizing the first data strobe signal, the second data strobe signal, and the third data strobe signal respectively; and the step of analyzing the sampling results to dynamically determine the delay amount for delaying the original data strobe signal further comprises:

comparing the first sample signal, the second sample signal, and the third sample signal to adjust spans between the sampling points respectively corresponding to the first data strobe signal, the second data strobe signal, and the third data strobe signal, wherein the spans correspond to the delay amount.

15. The memory control method of claim 14, wherein the step of analyzing the sampling results to dynamically determine the delay amount for delaying the original data strobe signal further comprises:

comparing the first sample signal, the second sample signal, and the third sample signal to further adjust shift amounts of the first data strobe signal, the second data strobe signal, and/or the third data strobe signal.

16. The memory control method of claim 14, wherein the memory control method is capable of dynamically adjusting the plurality of sampling points to correctly derive the data carried by the data signal according to the second data strobe signal; and the memory control method further comprises:

dynamically keeping the sampling point corresponding to the first data strobe signal centered at a prior data transition time point adjacent to the data; and dynamically keeping the sampling point corresponding to the third data strobe signal centered at a posterior data transition time point adjacent to the data.

17. The memory control method of claim 14, further comprising:

if a sampling result carried by the first sample signal is not equivalent to a sampling result carried by the second sample signal, and if the sampling result carried by the second sample signal is not equivalent to a sampling result carried by the third sample signal, adjusting the spans between the sampling points respectively corresponding to the first data strobe signal, the second data strobe signal, and the third data strobe signal.

18. The memory control method of claim 17, further comprising:

if another sampling result carried by the second sample signal is equivalent to another sampling result carried by one sample signal out of the first sample signal and the third sample signal, and if the other sampling result carried by the second sample signal is not equivalent to another sampling result carried by the other sample signal out of the first sample signal and the third sample signal, adjusting shift amounts of the first data strobe signal, the second data strobe signal, and/or the third data strobe signal.

19. The memory control method of claim 11, wherein the step of sampling according to the data signal by utilizing the plurality of sampling points further comprises:

sampling the data signal by utilizing the plurality of sampling points;

wherein the step of analyzing the sampling results to dynamically determine the delay amount for delaying the original data strobe signal further comprises:

performing edge detection according to the sampling results; and determining the delay amount according to the edge detection.

20. The memory control method of claim 11, wherein the memory is a double data rate (DDR) memory.

* * * * *